United States Patent [19]
Tohda et al.

[11] Patent Number: 4,741,987
[45] Date of Patent: May 3, 1988

[54] PHOTOPOLYMERIZABLE COMPOSITION INCLUDING BENZOTRIAZOLE CARBOXYLIC ACID

[75] Inventors: Hiroyuki Tohda, Fujisawa; Shigeru Otawa, Yamato; Junichi Onodera, Yokosuka, all of Japan

[73] Assignee: Photopoly Ohka Co., Ltd., Japan

[21] Appl. No.: 61,212

[22] Filed: Jun. 12, 1987

Related U.S. Application Data

[63] Continuation of Ser. No. 817,032, Jan. 8, 1986, abandoned.

[30] Foreign Application Priority Data

Jan. 19, 1985 [JP] Japan ................................. 60-006675

[51] Int. Cl.$^4$ ........................... G03C 1/68; G03C 1/96
[52] U.S. Cl. ................................... 430/288; 430/281; 430/277; 430/954; 522/121
[58] Field of Search .............. 430/277, 954, 281, 288; 522/121

[56] References Cited

U.S. PATENT DOCUMENTS 4,438,190  3/1984  Ishimaru et al. ................ 430/284 X
4,572,888  2/1986  Maeda et al. ....................... 430/288

*Primary Examiner*—Paul R. Michl
*Assistant Examiner*—Cynthia Hamilton
*Attorney, Agent, or Firm*—Lowe, Price, LeBlanc, Becker & Shur

[57] ABSTRACT

The composition of this invention comprises:
(a) a thermoplastic organic polymer,
(b) a non-gaseous ethylenically unsaturated compound containing at least two terminal ethylenic groups capable of forming a polymer by photoinitiated addition polymerization,
(c) an addition polymerization initiator activatable by actinic radiation, and
(d) a benzotriazole carboxylic acid.

7 Claims, No Drawings

PHOTOPOLYMERIZABLE COMPOSITION INCLUDING BENZOTRIAZOLE CARBOXYLIC ACID

This application is a continuation of application Ser. No. 817,032, filed Jan. 8, 1986, now abandoned.

BACKGROUND OF THE INVENTION

1. Field of the Invention

A printed wiring board is prepared, by coating a photopolymerizable composition in a solution or laminating the photosensitive layer as a film resist to the copper surface of a copper-laminated board, applying imagewise exposure by actinic light, developing an image with a solvent or an aqueous alkaline solution to form a resist image on a copper substrate and then selectively applying etching or metal plating to the area of the copper surface not protected by the resist image. In this case, if the adhesion of resist film to the copper substrate is insufficient, the etching solution or the plating solution penetrates between the copper substrate and the resist film, whereby the resist is separated or lifted from the copper substrate to result in the resist chipping through etching, in the plating intrusion, and so on. This renders the picture lines or the images indistinct failing to obtain a desired circuit. This invention concerns a novel photopolymerizable composition and, more specifically, it relates to a photopolymerizable composition capable of forming a resist image with excellent adhesion to the copper surface of a copper laminated board used for the production of printed wiring boards and capable of development with a weak alkaline aqueous solution.

2. Description of the Prior Art

For the improvement in the adhesion of the resist to the copper surface, a method of adding the following compound to a photopolymerizable composition has been reported, for example, previously.

(1) Benzotriazole, benzoimidazole, benzothiazole, etc. (refer to Japanese Patent Publication No. 24035/1983)

(2) Imidazole, thiazole, tetrazole, triazole, etc. (refer to Japanese Patent Laid-Open No. 48752/1984)

(3) Diphenylthiocarbazone (refer to Japanese patent Laid-Open No. 67845/1981)

(4) Carbothioacid amide derivative (refer to Japanese Patent Laid-Open No. 113432/1984)

(5) Monoazaindole and its derivative (refer to Japanese Patent Laid-Open No. 46642/1984)

(6) Rhodanines (refer to Japanese Patent Laid-Open No. 125725/1984)

(7) Tetrazole and its derivative (refer to Japanese Patent Laid-Open No. 125726/1984)

(8) Lophine (refer to Japanese Patent Laid-Open No. 125727/1984)

(9) Theophylline (refer to Japanese Patent Laid-Open No. 125728/1984)

(10) 2-substituted-4,6-dithiol-s-triazine derivative (refer to Japanese Patent Laid-Open No. 152439/1984).

However, addition of these compounds involves problems, that the adhesion is not sufficient, or the resist film reacts with copper due to the ageing change after the coating or lamination to form a monomolecular film at the interface. This exerts an undesired effect on the succeeding step, for instance, defective etching in the etching process or insufficient peeling strength between the plated copper and resist in the plating process.

SUMMARY OF THE INVENTION

It is an object of this invention to provide a photopolymerizable composition capable of forming an extremely stable resist film with highly excellent adhesion to the copper surface and quite free from the effect of the ageing change after the coating or lamination.

This invention provides a photopolymerizable composition comprising:

(a) a thermoplastic organic polymer, (b) a non-gaseous ethylenically unsaturated compound containing at least two terminal ethylenic groups capable of forming a polymer by photoinitiated addition photopolymerization, (c) an addition polymerization initiator activatable by actinic radiation, and (d) a benzotriazole carboxylic acid represented by:

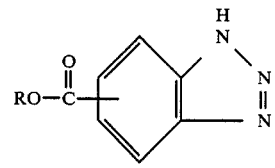

wherein R represents a hydrogen atom, an alkali metal atom or an aliphatic hydrocarbon group having from 1 to 12 carbon atoms.

DETAILED DESCRIPTION OF THE INVENTION (Thermoplastic Organic Polymer (a))

The component (a) according to this invention is a thermoplastic organic polymer. While various kinds of natural or synthetic resins may be used, a linear vinylic copolymer is preferred in view of compatibility with other components, adhesion to the surface of the substrate to be applied, etc. As the copolymerizable ingredient, various kinds of vinylic monomers can be used and suitable examples thereof can include methylmethacrylate, butylmethacrylate, ethylacrylate, styrene, α-methylstyrene, vinyl toluene, 2-hydroxyethyl methacrylate, 2-hydroxypropyl acrylate, acrylic acid, methacrylic acid, glycidyl methacrylate, t-butylamino ethylmethacrylate, 2,3-dibromopropyl methacrylate, 3-chloro-2-hydroxypropyl methacrylate, tetrahydrofulfryl methacrylate, tribromophenyl acrylate, acryl amide, acrylonitrile, butadiene, etc. However, for preparing a photopolymerizable composition that can be developed in an aqueous alkaline solution without using an organic solvent, it is necessary to incorporate either one or both of acrylic acid and methacrylic acid, which is an aliphatic unsaturated carboxylic acid, as the copolymerizable ingredient. Further, it is preferred to adjust the acid value of the polymer within a range from 30 to 130.

The content of the thermoplastic organic polymer in the photopolymerizable composition is, preferably, from 10 to 85% by weight in view of the film forming property and photo-curing property.

(Non-gaseous Ethylenically Unsaturated Compound (b))

The component (b) according to this invention is a non-gaseous ethylenically unsaturated compound containing at least two terminal ethylenic groups capable of forming a polymer by photoinitiated addition polymerization. Examples of them include acrylic acid ester, methacrylic acid ester, acryl amide, methacryl amide, allyl compound, vinyl ether compound and vinyl ester compound. The acrylic acid ester and methacrylic acid ester are esters of polyhydric alcohol with acryl or methacrylic acid. The polyhydric alcohol includes ethylene glycol, polyethylene glycol, propylene glycol, polypropylene glycol, neopentyl glycol, trimethylol propane, pentaerythritol, butanediol and trimethylol ethane.

The acryl amide and methacryl amide include methylene bis-acryl amide, methylene bis-methacryl amide, ethylene diamine bisacrylamide, ethylenediamine bismethacrylamide, hexamethylenediamine bisacrylamide and hexamethylene diamine bismethacrylamide.

The allyl compound is a diallyl ester of phthalic acid, adipic acid and malonic acid.

The vinyl ether compound is a vinyl ether of the above-mentioned polyhydric alcohol and the vinyl ester compound can include, for example, divinyl succinate, divinyl adipate and divinyl phthalate.

The content of the non-gaseous ethylenically unsaturated compound in the photopolymerizable composition is, preferably, from 10 to 85% by weight also in view of the film forming property and the photo-curing property.

(Photopolymerization Initiator (c))

The component (c) according to this invention is an addition polymerization initiator for initiating the polymerization of the above-mentioned unsaturated compound (b) under the irradiation of actinic light and it can include, for example, anthraquinone and anthraquinone derivatives such as 2-methyl anthraquinone and 2-ethylanthraquinone; benzoin and benzoin derivatives such as benzoin methyl ether and benzoin ethyl ether; benzophenone, phenanthrenequinone and 4,4'-bis(dimethylamino) benzophenone. These photopolymerization initiators may be used either alone or in combination of two or more of them.

The photopolymerization initiator in the photopolymerizable composition according to this invention is contained, preferably, in an amount of from 1 to 15% by weight.

(Benzotriazole Carboxylic Acid (d))

The component (d) according to this invention is a benzotriazole carboxylic acid represented by the general formula:

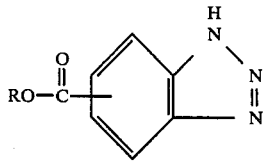

where R represents a hydrogen atom, an alkali metal atom or an aliphatic hydrocarbon group having from 1 to 12 carbon atoms. A mixture of 4-benzotriazole carboxylic acid and 5-benzotriazole carboxylic acid is commercially available under the trade name of "Carboxybenzotriazole" (product manufactured by The Sherwin-Williams Company), which can be used as such but with no particular restriction thereto.

The content of the benzotriazole carboxylic acid in the photopolymerizable composition is, preferably, from 0.005 to 5% by weight and, more preferably, from 0.05 to 3% by weight.

(Auxiliary ingredient)

In addition to the above-mentioned components, thermal polymerization inhibitor, dye, pigment, improver for coating performance, flame retardant, flame retarding auxiliaries, etc, may also be added to the photopolymerizable composition as secondary ingredients according to this invention and these ingredients may be selected in the same manner as in the conventional photopolymerizable compositions.

(Method of Use)

The respective ingredients in the photopolymerizabale composition according to this invention are used while being dissolved and mixed in an appropriate solvent. Typical examples of the appropriate solvent can include methyl ethyl ketone, ethyl acetate, toluene, methylene chloride and trichloroethane, with no particular restriction thereto.

The photopolymerizable composition according to this invention is directly coated in a form of a solution dissolved into a solvent as described above onto a substrate such as a copper-laminated board and dried to form a resist film, or is coated in the above-mentioned solution form on a polyester film as a support to dry to form a resist film and laminated in a form of the resist film by heating onto the copper-laminated board. Then, imagewise exposure is applied to the resist film with actinic light; development is conducted to form a resist image on the substrate and etching or metal plating is applied to the area of the copper surface not protected with the resist film to thereby produce a printed wiring board.

For the developing solution, an organic solvent such as 1,1,1-trichloroethane, an aqueous alkaline solution or an aqueous solution of organic solvent is used.

The procedures for the coating, lamination, imagewise exposure, development, etching and metal plating can be conducted by ordinary procedures.

(ADVANTAGE OF THE INVENTION)

The photopolymerizable composition according to this invention, (when using direct coating as a solution or by lamination as a resist film to the copper surface), is excellent in the adhesion of the resist film to the copper surface, and is also stable with extremely less reduced ageing change after the lamination. Hence it causes no separating or lifting of the resist film from the copper surface in the subsequent etching or plating step, which leads to the chipping of the resist end or intrusion of the plating. Accordingly, a satisfactorily printed wiring board can be produced to improve the quality and workability for the production of the printed wiring board by using the photopolymerizable composition according to this invention.

Further, since the photopolymerizable composition according to this invention can be developed in the developing step by using an aqueous alkaline solution without an organic solvent, it is safe in view of the toxicity and the flammability and capable of reducing the cost for the production of the printed circuit boards.

EMBODIMENT OF THE INVENTION

This invention will now be described in more detail referring to the examples.

EXAMPLES 1-5, COMPARATIVE EXAMPLE 1

| | |
|---|---|
| Methylmethacrylate/methacrylic acid/ hydroxypropyl methacrylate (65/15/20 weight ratio) copolymer (average molecular weight: about 50,000) | 100 g |
| Trimethylolpropane triacrylate | 15 g |
| Tetraethylene glycol diacrylate | 20 g |
| Benzophenone | 5 g |
| Michler's ketone | 0.6 g |
| Crystal violet | 0.1 g |
| Methyl ethyl ketone | 300 g |

Six batches of the above compositions were prepared in accordance with the above-mentioned formulation and "carboxybenzotriazole" (product manufactured by The Sherwin-Williams Company) were added as the benzotriazole carboxylic acid to five batches by 0.05 g, 0.1 g, 0.5 g, 1.0 g and 3 g respectively while using one batch with no such addition for the comparison.

Each batch was coated on a polyethylene terephthalate film of 25 μm thickness and dried to obtain a resist film of 30 μm thickness. Then, each resist film was laminated on to a cleaned copper-laminated board for printed circuit by using a laminator at a temperature of 103° C., a pressure of 2.0 kg/cm², a rate of 1.8 m/min and a board surface temperature of 23° C. Then, actinic radiation was exposed at 90 mJ/cm² by using a super high pressure mercury lamp Model HMW-201B (3 kW) manufactured by Oak Company by way of a photomask, and the polyethylene terephthalate film was peeled off and discarded leaving the exposed resist adherent to the copper surface. The board was then developed by using a spray developing machine in an aqueous 2% solution of sodium carbonate at 32° C. for 80 sec. and then washed with water and dried. Each of the thus obtained boards was subjected to an adhesion test with regard to (A) "the degree of peeling upon rapid peeling of an adhesive tape appended to the resist film left on the copper surface" and (B) "the degree of peeling upon rapid peeling of the adhesive tape appended to the resist film after immersing the film left on the copper surface into an aqueous 42% solution of borofluoric acid at 25° C. As shown by the results in Table 1, the photopolymerizable composition according to this invention is much more excellent in the adhesion characteristics as compared with the photopolymerizable composition in the prior art.

TABLE 1 (1)

| | Addition amount of carboxy benzotriazole | Adhesion test (A) |
|---|---|---|
| Comparative Example 1 | not-added | x |
| Example 1 | 0.05 g | o |
| Example 2 | 0.1 g | o |
| Example 3 | 0.5 g | o |
| Example 4 | 1.0 g | o |
| Example 5 | 3.0 g | o |

TABLE 1 (2)

| | Adhesion Test (B) | | |
|---|---|---|---|
| | Immersion 30 min | Immersion 60 min | Immersion 90 min |
| Comparative Example 1 | x | x | x |
| Example 1 | o | o | Δ |
| Example 2 | o | o | o |
| Example 3 | o | o | o |
| Example 4 | o | o | o |
| Example 5 | o | o | o |

Description for symbols
x: complete peeling,
Δ: partial peeling of the resist,
o: no peeling at all.

EXAMPLE 6, COMPARATIVE EXAMPLES 2 AND 3

Compositions were prepared in the same procedures as in Examples 1-5 to obtain printed circuit substrates. In this case, "carboxybenzotriazole" was added by 0.5 g and benzotriazole and diphenyl thiocarbazone were added as Comparative Examples each by 0.5 g. The thus obtained substrates were maintained at a room temperature of 25° C., and ageing change was examined regarding the reaction between the resist film and the copper surface after 1, 3, 7 and 10 days. For examining the ageing change, the copper surface exposed by peeling the resist film from each of the specimens was immersed in an aqueous 2% solution of ammonium persulfate for 60 sec. and the specimen with the copper surface thereof being turned pink (soft etching) was estimated as "satisfactory". As shown by the results in Table 2, the composition according to this invention is much more superior in the stability as compared with the conventional compositions.

TABLE 2

| | Example 6 Carboxybenzo triazole | Comparative Example 2 Benzotriazole | Comparative Example 3 Diphenylthio carbazone |
|---|---|---|---|
| 1 day after | o | Δ | o |
| 3 day after | o | x | x |
| 7 day after | o | x | x |
| 10 day after | Δ | x | x |

Description for symbols
o: satisfactory
Δ: moderate
x: failed.

What is claimed is:
1. A photopolymerizable composition consisting essentially of:
(a) a thermoplastic organic polymer,
(b) a non-gaseous ethylenically unsaturated compound containing at least two terminal ethylenic groups capable of forming a polymer by photoinitiated addition polymerization,
(c) an addition polymerization initiator activatable by actinic radiation, and
(d) from 0.005 to 5 percent by weight, based on the weight of the composition, of a benzotriazole carboxylic acid or its derivative represented by the general formula:

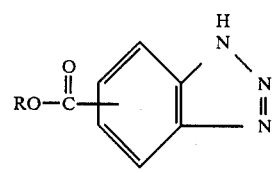

where R represents a hydrogen atom, an alkali metal atom or an aliphatic hydrocarbon group having from 1 to 12 carbon atoms.

2. The photopolymerizable composition as defined in claim 1, comprising:
   (a) from 10 to 85% by weight of the thermoplastic organic polymer,
   (b) from 10 to 85% by weight of the ethylenically unsaturated compound,
   (c) from 1 to 15% by weight of the photopolymerization initiator, and
   (d) from 0.005 to 5% by weight of the benzotriazole carboxylic acid.

3. The photopolymerizable composition as defined in claim 1, wherein the thermoplastic organic polymer is a linear vinylic copolymer.

4. The photopolymerizable composition as defined in claim 3, wherein the linear vinylic copolymer is a copolymer of compounds selected from the group consisting of methyl methacrylate, butyl methacrylate, ethyl acrylate, styrene, α-methylstyrene, vinyl toluene, 2-hydroxyethyl methacrylate, 2-hydroxypropyl acrylate, acrylic acid, methacrylic acid, glycidyl methacrylate, t-butyl aminoethyl methacrylate, 2,3-dibromopropyl methacrylate, 3-chloro-2-hydroxypropyl methacrylate, tetrahydrofurfryl methacrylate, tribromophenyl acrylate, acryl amide, acrylonitrile and butadiene.

5. The photopolymerizable composition as defined in claim 3, wherein the linear vinylic copolymer is soluble in an aqueous alkaline solution.

6. The photopolymerizable composition as defined in claim 5, wherein the linear vinylic copolymer soluble in an aqueous alkaline solution has an acid value from 30 to 130.

7. The photopolymerizable composition as defined in claim 1, wherein the benzotriazole carboxylic acid is a mixture of 4-benzotriazole carboxylic acid and 5-benzotriazole carboxylic acid.

* * * * *